United States Patent
Sun et al.

(10) Patent No.: US 11,818,969 B2
(45) Date of Patent: Nov. 14, 2023

(54) MEMORY DEVICES AND METHOD OF FORMING THE SAME

(71) Applicant: GLOBALFOUNDRIES Singapore Pte. Ltd., Singapore (SG)

(72) Inventors: Jianxun Sun, Singapore (SG); Juan Boon Tan, Singapore (SG); Tupei Chen, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 308 days.

(21) Appl. No.: 17/096,950

(22) Filed: Nov. 13, 2020

(65) Prior Publication Data

US 2022/0158090 A1    May 19, 2022

(51) Int. Cl.
 *H01L 45/00*    (2006.01)
 *H10N 70/00*    (2023.01)
 *H10B 63/00*    (2023.01)

(52) U.S. Cl.
 CPC .......... *H10N 70/841* (2023.02); *H10B 63/00* (2023.02); *H10N 70/021* (2023.02); *H10N 70/063* (2023.02); *H10N 70/8833* (2023.02)

(58) Field of Classification Search
 CPC ............. H01L 45/1273; H01L 45/1233; H01L 45/124; H10N 70/8418
 See application file for complete search history.

(56) References Cited

U.S. PATENT DOCUMENTS

| | | | |
|---|---|---|---|
| RE37,259 E * | 7/2001 | Ovshinsky | H01L 45/1233 257/3 |
| 6,800,563 B2 * | 10/2004 | Xu | H01L 45/16 438/719 |
| 9,997,703 B2 | 6/2018 | Lam et al. | |
| 2011/0227030 A1 | 9/2011 | Pickett et al. | |
| 2022/0158093 A1 * | 5/2022 | Thong | H01L 27/24 |

OTHER PUBLICATIONS

Gang Niu et al., Geometric conductive filament confinement by nanotips for resistive switching of HfO2-RRAM devices with high performance, Scientific Reports, 2016, pp. 1-9, vol. 6.
Yoonho Ahn et al., Effects of a Nb nanopin electrode on the resistive random-access memory switching characteristics of NiO thin films, Nanoscale, 2018, pp. 13443-13448, vol. 10, The Royal Society of Chemistry.

* cited by examiner

*Primary Examiner* — Mark V Prenty
(74) *Attorney, Agent, or Firm* — David Cain (57) ABSTRACT

The disclosed subject matter relates generally to memory devices and a method of forming the same. More particularly, the present disclosure relates to resistive random-access (ReRAM) memory devices. The present disclosure provides a memory device including a first electrode having tapered sides that converge at a top of the first electrode, a dielectric layer disposed on and conforming to the tapered sides of the first electrode, a resistive layer in contact with the top of the first electrode and the dielectric layer, and a second electrode disposed on the resistive layer.

17 Claims, 7 Drawing Sheets

MEMORY DEVICES AND METHOD OF FORMING THE SAME

FIELD OF THE INVENTION

The disclosed subject matter relates generally to memory devices and a method of forming the same. More particularly, the present disclosure relates to resistive random-access (ReRAM) memory devices.

BACKGROUND

Semiconductor devices and integrated circuit (IC) chips have found numerous applications in the fields of physics, chemistry, biology, computing, and memory devices. An example of a memory device is a non-volatile (NV) memory device. NV memory devices are programmable and have been extensively used in electronic products due to its ability to retain data for long periods, even after the power has been turned off. Exemplary categories for NV memory may include resistive random-access memory (ReRAM), erasable programmable read-only memory (EPROM), flash memory, ferroelectric random-access memory (FeRAM), and magnetoresistive random-access memory (MRAM).

Resistive memory devices can operate by changing (or switching) between two different states: a high resistance state (HRS), which may be representative of an off or '0' state; and a low resistance state (LRS), which may be representative of an on or '1' state. However, these devices may experience large variations in resistive switching characteristics and may cause large fluctuations of current flow within the device, which decreases the performance of the device and increases its power consumption.

Therefore, there is a need to provide improved memory devices that can overcome, or at least ameliorate, one or more of the disadvantages as described above.

SUMMARY

In an aspect of the present disclosure, there is provided a memory device including a first electrode having tapered sides that converge at a top of the first electrode, a dielectric layer disposed on and conforming to the tapered sides of the first electrode, a resistive layer in contact with the top of the first electrode and the dielectric layer, and a second electrode disposed on the resistive layer.

In another aspect of the present disclosure, there is provided a method of forming a memory device by forming a first electrode having tapered sides that converge at a top of the first electrode, forming a dielectric layer on and conforming to the tapered sides of the first electrode, forming a resistive layer to contact the top of the first electrode and the dielectric layer, and forming a second electrode on the resistive layer.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

FIG. 3 through FIG. 11 are cross-sectional views depicting an exemplary set of steps for fabricating a memory device, in accordance with embodiments of the present disclosure.

DETAILED DESCRIPTION

Various illustrative embodiments of the present disclosure are described below. The embodiments disclosed herein are exemplary and not intended to be exhaustive or limiting to the present disclosure.

Figure 1:
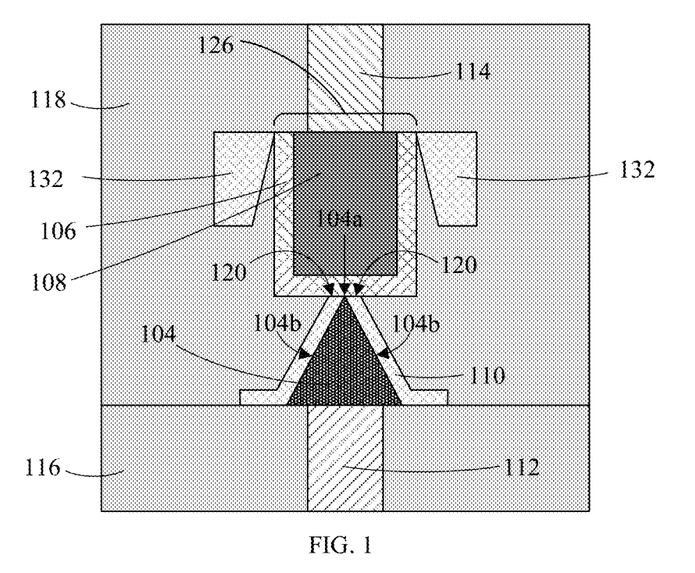
FIG. 1 is a cross-sectional view of a memory device, in accordance with embodiments of the present disclosure.

Referring to FIG. 1, the memory device of the present disclosure includes the first electrode 104, a resistive layer 106, and a second electrode 108. The first electrode 104 has tapered sides 104b that converge at a top 104a of the first electrode 104. A dielectric layer 110 is disposed on and conforms to the tapered sides 104b of the first electrode 104.

The dielectric layer 110 may include an electrically insulating material such as, but not limited to, silicon nitride ($Si_3N_4$), nitrogen doped silicon carbide (SiCN), or $SiN_wC_xH_z$ (i.e., NBLoK™), wherein each of w, x, y, and z independently has a value greater than 0 and less than 0.75. The dielectric layer 110 may have an upper surface 120 that is substantially coplanar with the top 104a of the first electrode 104.

The resistive layer 106 is disposed on the top 104a of the first electrode 104. In particular, the resistive layer 106 may contact the top 104a of the first electrode 104 and the upper surface 120 of the dielectric layer 110. Examples of the material for the resistive layer 106 may include, but are not limited to, carbon polymers, perovskites, silicon dioxide, metal oxides, or nitrides. Some examples of metal oxides may include lanthanide oxides, tungsten oxide, zinc oxide, nickel oxide, niobium oxide, titanium oxide, hafnium oxide, aluminum oxide, tantalum oxide, zirconium oxide, yttrium oxide, scandium oxide, magnesium oxide, chromium oxide, and vanadium oxide. Examples of nitrides may include boron nitride and aluminum nitride. In some embodiments, metal oxides with a bandgap greater than 3 eV may be used. Examples of such oxides may include titanium oxide, tungsten oxide, niobium oxide, nickel oxide, zinc oxide, lanthanide oxides, hafnium oxide, aluminum oxide, tantalum oxide, zirconium oxide, and yttrium oxide.

The second electrode 108 is disposed on the resistive layer 106. As shown, the resistive layer 106 may conform to a bottom and side surfaces of the second electrode 108. The first electrode 104 and the second electrode 108 may be made of a conductive material. Examples of the conductive material may include, but not limited to, tantalum (Ta), hafnium (Hf), titanium (Ti), copper (Cu), silver (Ag), cobalt (Co), tungsten (W), ruthenium (Ru), platinum (Pt), or an alloy thereof. In an embodiment, the second electrode 108 may be made of a different material as the first electrode 104. In another embodiment, the second electrode 108 may be made of the same material as the first electrode 104.

The first electrode 104 and the second electrode 108 may be connected to various interconnect structures 112, 114 to send or receive electrical signals between other circuitry and/or active components in a memory device. The interconnect structures 112, 114 may include a metal such as copper, cobalt, aluminum, or an alloy thereof.

The memory device may further include a first inter-metal dielectric region 116 and a second inter-metal dielectric region 118. The first inter-metal dielectric region 116 may include a first interconnect structure 112, while the second inter-metal dielectric region 118 may include the dielectric layer 110, the first electrode 104, the resistive layer 106, the second electrode 108, and the second interconnect structure 114. An opening 126 may be formed in the second inter-metal dielectric region 118 and being positioned above the first electrode 104. The resistive layer 106 and the second electrode 108 may be disposed in the opening 126 with the resistive layer 106 being conformed to sidewalls and a bottom of the opening 126.

The second inter-metal dielectric region 118 may additionally include mask elements 132. The mask elements 132 may act as a mask that defines the position of the opening 126 above the first electrode 104 during the fabrication of the memory device. As shown, the opening 126, the resistive layer 106, and the second electrode 108 may be positioned between the mask elements 132. The mask elements 132 may have upper surfaces that are substantially coplanar with an upper surface of the second electrode 108.

The second inter-metal dielectric region 118 may be disposed above the first inter-metal dielectric region 116. The first electrode 104 may be disposed on the first interconnect structure 112, and the second interconnect structure 114 may be disposed on the second electrode 108. Examples of dielectric material in the first inter-metal dielectric region 116 and the second inter-metal dielectric region 118 may include, but are not limited to, silicon dioxide, tetraethyl orthosilicate (TEOS), or a material having a chemical composition of $SiC_xO_yH_z$, wherein x, y, and z are in stoichiometric ratio.

Examples of the active components (not shown) that may be connected to the first electrode 104 and the second electrode 108 through the respective interconnect structures 112, 114 may include diodes (e.g., a bi-directional diode, a single-photon avalanche diode, etc.) or transistors such as, but not limited to, planar field-effect transistor, fin-shaped field-effect transistors (FinFETs), ferroelectric field-effect transistors (FeFETs), complementary metal-oxide semiconductor (CMOS) transistors, and bi-polar junction transistors (BJT).

Figure 2A:
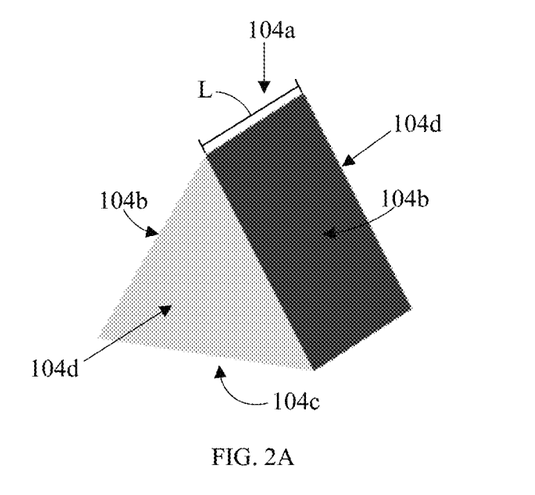
FIG. 2A, FIG. 2B, and FIG. 2C are perspective views depicting embodiments of the first electrode, in accordance with the present disclosure.
Figure 2B:
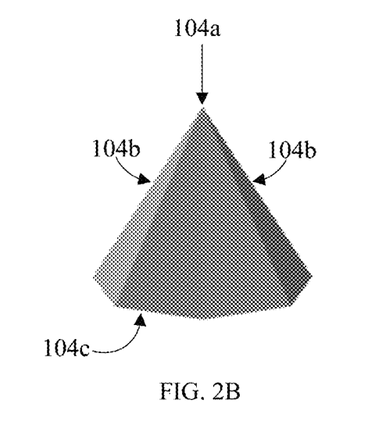
Figure 2C:
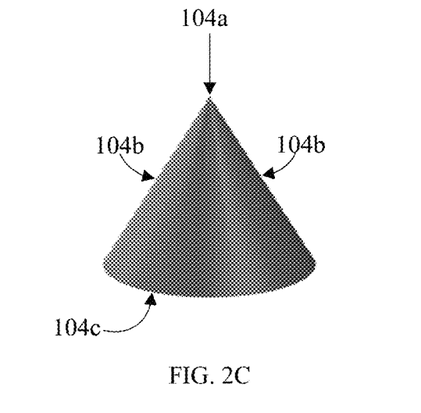

FIG. 2A, FIG. 2B, and FIG. 2C depict embodiments of the first electrode 104. In the representative embodiments, the top 104a of the first electrode 104 is positioned above a bottom surface 104c of the first electrode 104.

As shown in FIG. 2A, the top 104a of the first electrode 104 may be an edge with a length L. The first electrode 104 may have tapered sides 104b that converges at the top edge 104a, and side surfaces 104d that are parallel to each other. In an embodiment, the first electrode 104 may have a triangular cross-sectional shape. Additionally, the bottom surface 104c may have a polygonal shape (e.g., pentagonal, hexagonal, heptagonal, octagonal, nonagonal, decagonal, etc.).

As shown in FIG. 2B, the first electrode 104 may be a pyramid with a polygonal base. In particular, the bottom surface 104c may have a polygonal shape as described in FIG. 2A. In an embodiment, the first electrode 104 may have a pyramidal geometry.

As shown in FIG. 2C, the first electrode 104 may be a cone with an elliptical base. The bottom surface 104c may have a generally circular, elliptical, or oval shape. In an embodiment, the first electrode 104 may have a conical geometry.

In the embodiments shown in FIGS. 2B and 2C, the tapered sides 104b may converge to form a substantially pointed tip at the top 104a of the first electrode 104. Alternatively, the tapered sides 104b may converge to form a substantially rounded tip at the top 104a of the first electrode 104.

Conductive paths may be configured to form in the resistive layer 106 in response to electric signals (e.g., a set voltage or current). In particular, a conductive path may form between the top 104a of the first electrode 104 and the second electrode 108. For example, a "set" voltage or a "reset" voltage may be applied to the first interconnect structure 112 to provide a potential difference between the first electrode 104 and the second electrode 108. This potential difference may cause the formation of the conductive path (not shown) in the resistive layer 106 to electrically link the first electrode 104 and the second electrode 108. The conductive path may be a filament that is formed by diffusion or drift of electrical charges (e.g., ions, electrons) induced by the potential difference.

The resistive layer 106 may also be configured to have a switchable resistance in response to a change in the electric signal. The formation of the filament in the resistive layer 106 may reduce the resistance of the resistive layer 106 when the electric signal is applied. Upon a reversed flow of the electric signal, the filament may be removed and the resistance of the resistive layer 106 may be increased, thereby enabling a controllable resistive nature of the resistive layer 106. The resistive layer 106 may exhibit resistive changing properties characterized by different resistance states of the material forming this layer. These resistance states (e.g., a high resistance state (HRS) or a low resistance state (LRS)) may be used to represent one or more bits of information.

Advantageously, by providing a first electrode 104 with tapered sides 104b and a dielectric layer 110 that covers and conforms to the tapered sides 104b, electrical charges may only diffuse or drift through the top 104a of the first electrode and not its tapered sides 104b, thereby reducing the area of contact between the resistive layer 106 and the first electrode 104. Additionally, by arranging the dielectric layer 110 to conform to the tapered sides 104b, the dielectric layer 110 acts as an electrical insulator to prevent the formation of any conductive path that could have linked the sides 104b of the first electrode 104 to the second electrode 108.

With a reduced area of contact between the resistive layer 106 and the first electrode 104, the conductive paths formed between the first electrode 104 and the second electrode 108 can be confined, and do not form randomly along the length of the resistive layer 106. More advantageously, since the top 104a of the first electrode 104 has the strongest localization of electric fields (i.e., the largest concentration of electric charges), the formation of the conductive path may be confined within a region in the resistive layer 106 that is proximate to the top 104a of the first electrode 104.

The confinement of the conducting path may help to reduce the stochasticity of its formation, which in turn reduces the cycle-to-cycle and device-to-device variability of the memory devices in the high resistive state. In other words, the variability of the resistance of the resistive layer 106 in the high resistive state may be reduced. This may enable a stable switching of the resistive states in the resistive layer 106 during the operation of the device and may reduce its overall power consumption.

The memory device described herein may be a resistive memory device. Examples of the resistive memory device may include, but are not limited to, oxide random-access memory (OxRAM) or conductive bridge random-access memory (CBRAM).

FIGS. 3 through 11 show a set of steps that may be used to create the memory devices as provided for in embodiments of the present disclosure.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" includes deposition of material or photoresist, patterning, exposure, development, etching, cleaning, and/or removal of the material or photoresist as required in forming a described pattern, structure, or opening. Examples of techniques for patterning include, but not limited to, wet etch lithographic processes, dry etch lithographic processes, or direct patterning processes. Such techniques may use mask sets and mask layers.

Figure 3:
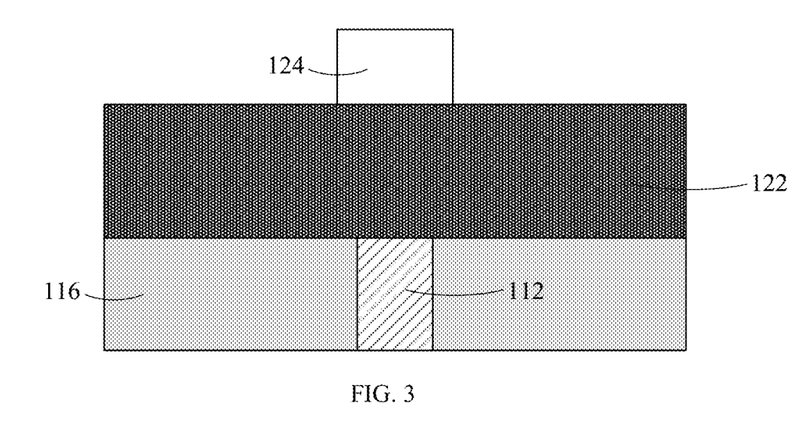

Referring to FIG. 3, a first inter-metal dielectric region 116 may be provided. A first interconnect structure 112 may be formed in the first inter-metal dielectric region 116. A conductive material layer 122 may be formed on the first interconnect structure 112 and the first inter-metal dielectric region 116 using the deposition techniques described herein. A photoresist may be deposited on the conductive material layer 122 and then patterned to define a mandrel mask 124.

Figure 4:
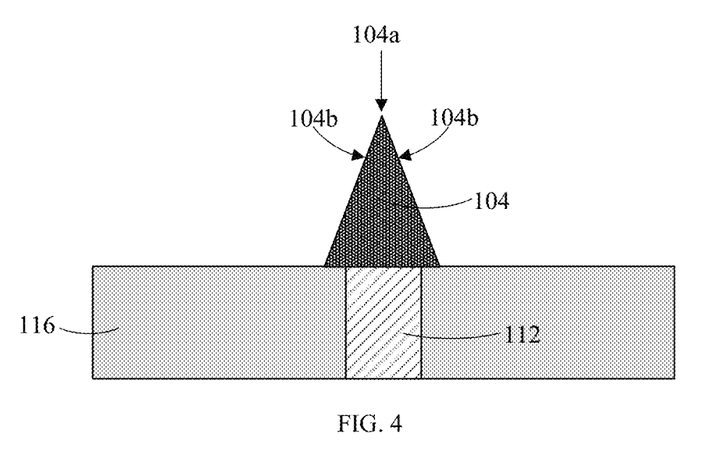

Referring to FIG. 4, the conductive material layer 122 may be patterned using the patterning techniques described herein. For example, a dry etch may be used to pattern the conductive material layer 122 to form a first electrode 104 with tapered sides 104*b* and a top 104*a*. The top 104*a* and the tapered sides 104*b* may be formed due to the erosion of the mandrel mask 124 during the etch. The mandrel mask 124 may be removed after the etching. The first electrode 104 may be etched such that it has tapered sides 104*b* that converge at the top 104*a*. The top 104*a* may be either pointed or rounded. Alternatively, the top 104*a* may be an edge.

Figure 5:
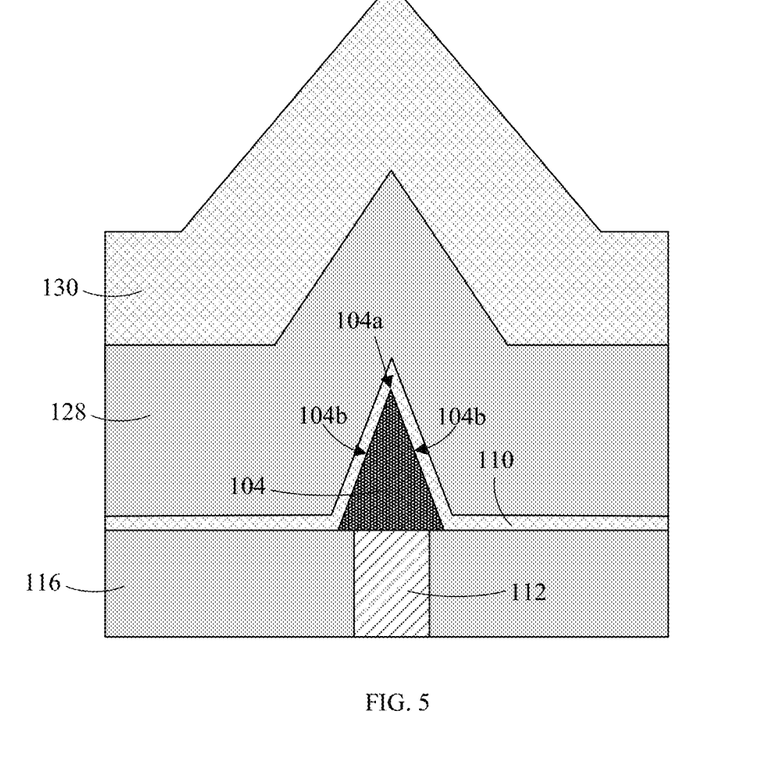

Referring to FIG. 5, a dielectric layer 110 may be deposited on the first electrode 104 and the first interconnect structure 112. The dielectric layer 110 may be deposited using a conformal deposition process, such as an ALD process or a highly-conformal CVD process. The deposited dielectric layer 110 covers the top 104*a* and the tapered sides 104*b* of the first electrode 104. The dielectric layer 110 may protect the tapered sides 104*a* of the first electrode 104 from damage (e.g., sputtering of the sides) during subsequent fabrication steps.

An oxide layer 128 may be deposited on the dielectric layer 110. Exemplary materials for the oxide layer 128 may include but are not limited to, silicon dioxide, tetraethyl orthosilicate (TEOS), or a material having a chemical composition of $SiC_xO_yH_z$, wherein x, y, and z are in stoichiometric ratio. Thereafter, a mask element layer 130 may be deposited on the oxide layer 128. The mask element layer 130 may include a material such as, but not limited to, silicon nitride ($Si_3N_4$), nitrogen doped silicon carbide (SiCN), or $SiN_wC_xH_z$ (i.e., NBLoK™), wherein each of w, x, y, and z independently has a value greater than 0 and less than 0.75.

Figure 6:
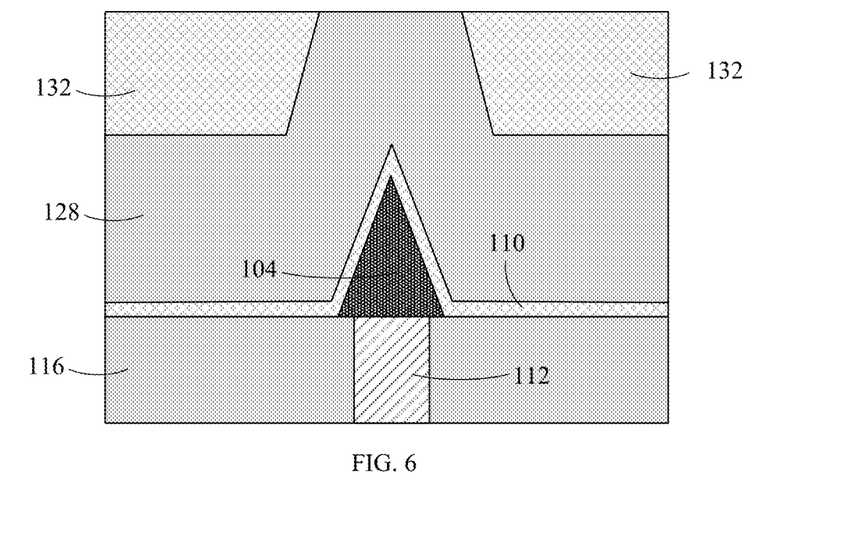

The oxide layer 128 and the mask element layer 130 may be deposited using a conformal deposition process, such as an ALD process or a highly-conformal CVD process. As shown, the oxide layer 128 and the mask element layer 130 may be deposited such that the layers follow the contour Referring to FIG. 6, a planarization process (e.g., chemical mechanical planarization (CMP)) may be performed on the oxide layer 128 and the mask element layer 130. The planarization process severs the mask element layer 130 to form mask elements 132 and exposes a portion of the oxide layer 128 previously covered by the mask element layer 130. As shown, the mask elements 132 are separated by the oxide layer 128.

Figure 7:
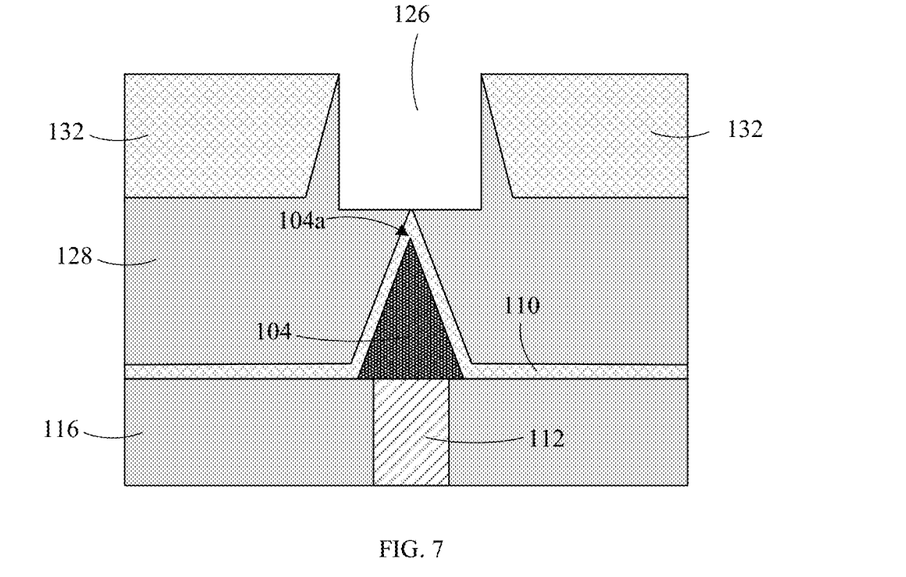

Referring to FIG. 7, an opening 126 may be defined in the oxide layer 128. The opening 126 may be formed above the first electrode 104 and between the mask elements 132. The opening 126 may be formed by patterning the oxide layer 128 using the mask elements 132 to define the opening 126. For example, a first etch may be performed to selectively remove the material in the oxide layer 128. The etch selectivities of the oxide layer 128 and the mask elements 132 may be engineered to ensure minimal loss of the material in the mask elements during the reactive ion etch. The first etching step may be terminated upon reaching the dielectric layer 110. A reactive ion etch technique may be used in the first etching step.

Figure 8:
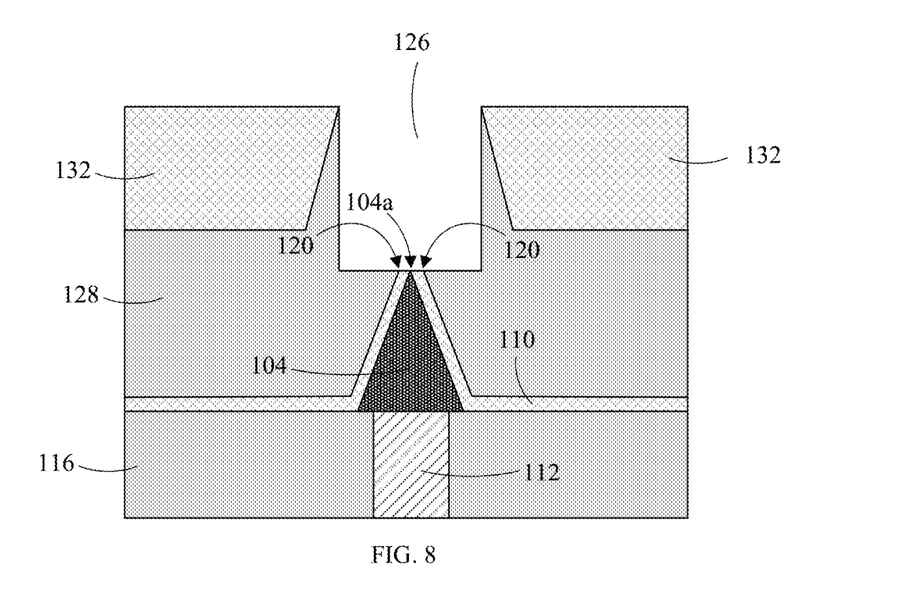

Referring to FIG. 8, the process of defining the opening 126 may also include a second etch. The second etch may be performed on a bottom surface of the opening 126 to selectively remove the dielectric layer 110 and expose the top 104*a* of the first electrode 104. The second etching step may be terminated upon reaching the top 104*a* of the first electrode 104. The etch selectivities of the dielectric layer 110 and the first electrode 104 may be engineered to ensure minimal loss of material to the top 104*a*. Additionally, the second etching step may also form an upper surface 120 of the dielectric layer 110 that is substantially coplanar with the top 104*a* of the first electrode 104. A dry etch may be used in the second etching step.

Figure 9:
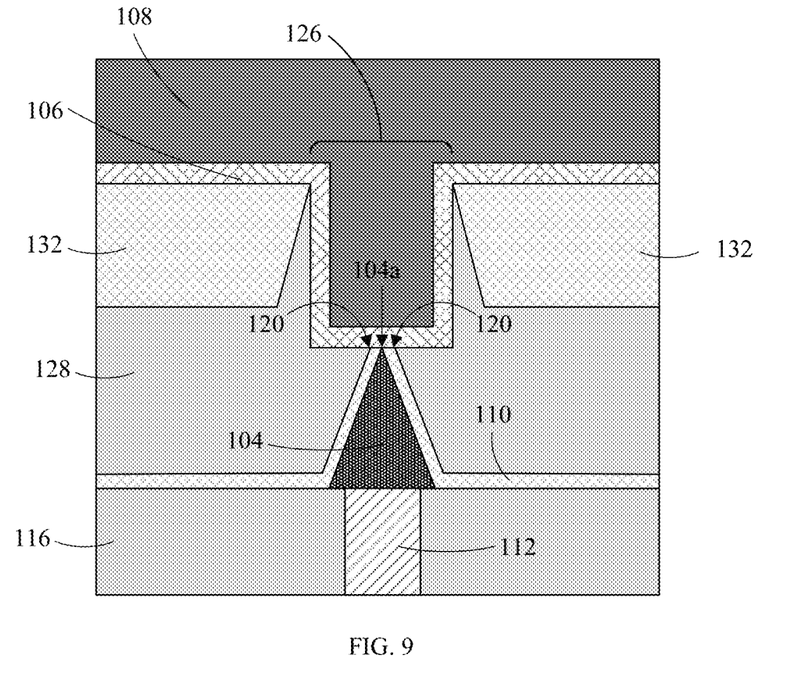

Referring to FIG. 9, a resistive layer 106 is deposited in the opening 126. In particular, a conformal deposition may be performed to form the resistive layer 106 such that the resistive layer 106 conforms to sidewalls and the bottom surface of the opening 126. Thereafter, a second electrode 108 is deposited on the resistive layer 106 using the deposition techniques described herein.

Figure 10:
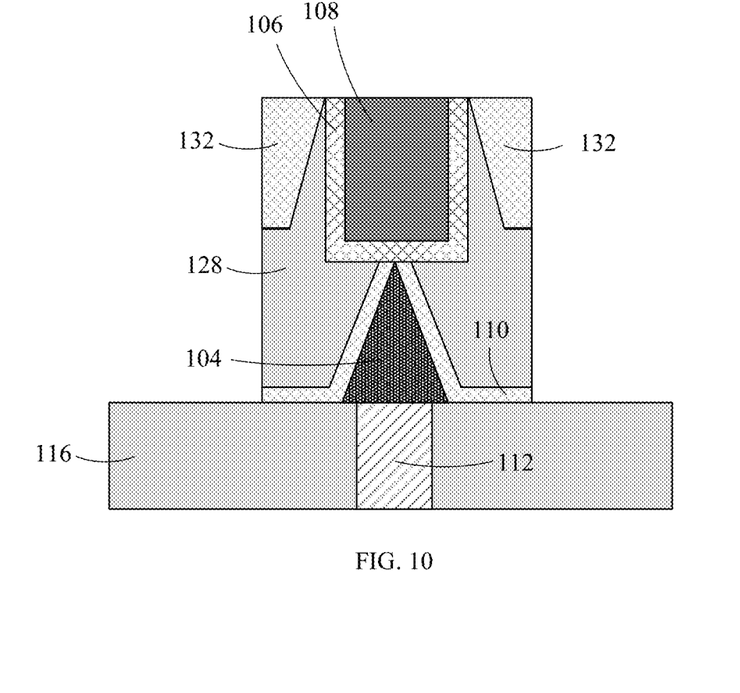

Referring to FIG. 10, a planarization process (e.g., CMP process) may be performed on the resistive layer 106 and the second electrode 108 such that the upper surfaces of the mask elements 132 are substantially coplanar with the upper surface of the second electrode 108. Thereafter, an etching process may be performed to remove portions of the dielectric layer 110 covering the first inter-metal dielectric region 116.

Figure 11:
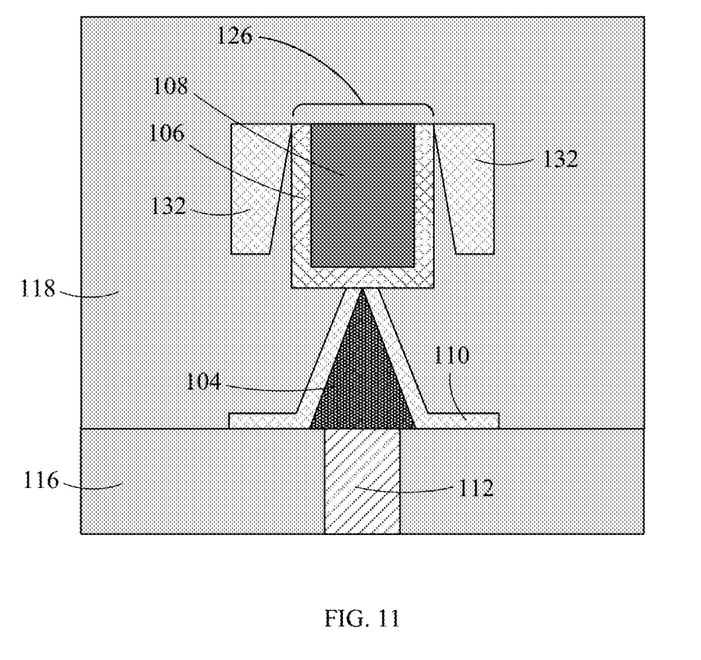

Referring to FIG. 11, additional deposition of dielectric material may be performed to form the second inter-metal dielectric region 118. The deposited dielectric material embeds the second electrode 108, the mask elements 132, and the resistive layer 106. Thereafter, the second inter-metal dielectric region 118 may be patterned using patterning techniques to define openings (not shown) above the second electrode 108, which are subsequently filled with a metal to form a second interconnect structure (not shown in FIG. 11) that contacts the second electrode 108.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many processes are only mentioned briefly herein or omitted entirely without providing the well-known process details.

As will be readily apparent to those skilled in the art upon a complete reading of the present application, the disclosed semiconductor devices and methods of forming the same may be employed in manufacturing a variety of different integrated circuit products, including, but not limited to, memory cells, NV memory devices, FinFET transistor devices, CMOS devices, etc.

What is claimed is:

1. A memory device comprising:
   a first electrode having tapered sides that converge at a top of the first electrode;
   a dielectric layer disposed on and conforming to the tapered sides of the first electrode;
   a resistive layer in contact with the top of the first electrode and the dielectric layer; and
   a second electrode disposed on the resistive layer, wherein the resistive layer conforms to a bottom and side surfaces of the second electrode.

2. The device of claim 1, wherein the dielectric layer has an upper surface that is substantially coplanar with the top of the first electrode.

3. The device of claim 1, wherein the tapered sides of the first electrode converge to form a substantially pointed tip at the top of the first electrode.

4. The device of claim 1, wherein the tapered sides of the first electrode converge to form a substantially rounded tip at the top of the first electrode.

5. The device of claim 1, wherein the top of the first electrode is an edge with a length.

6. The device of claim 1, further comprising:
   a first inter-metal dielectric region comprising a first interconnect structure, wherein the first electrode is disposed on the first interconnect structure; and
   a second inter-metal dielectric region above the first inter-metal dielectric region, the second inter-metal dielectric region comprising a second interconnect structure, wherein the second interconnect structure is disposed on the second electrode.

7. The device of claim 6, further comprising mask elements in the second inter-metal dielectric region, wherein the second electrode is between the mask elements and the mask elements have upper surfaces that are substantially coplanar with an upper surface of the second electrode.

8. The device of claim 1, wherein the first electrode has a bottom surface with an elliptical shape.

9. The device of claim 8, wherein the first electrode has a conical geometry.

10. The device of claim 1, wherein the first electrode has a bottom surface with a polygonal shape.

11. The device of claim 10, wherein the first electrode has a pyramidal geometry.

12. The device of claim 10, wherein the first electrode has a triangular cross sectional shape.

13. A method of forming a memory device comprising:
   forming a first electrode having tapered sides that converge at a top of the first electrode;
   forming a dielectric layer on and conforming to the tapered sides of the first electrode;
   forming a resistive layer to contact the top of the first electrode and the dielectric layer; and
   forming a second electrode on the resistive layer, wherein the resistive layer conforms to a bottom and side surfaces of the second electrode.

14. A memory device comprising:
   a first electrode having tapered sides that converge at a top of the first electrode, wherein the top of the first electrode is an edge with a length;
   a dielectric layer disposed on and conforming to the tapered sides of the first electrode;
   a resistive layer in contact with the top of the first electrode and the dielectric layer; and
   a second electrode disposed on the resistive layer.

15. The device of claim 14, wherein the resistive layer conforms to a bottom and side surfaces of the second electrode.

16. The device of claim 15, further comprising:
   a first inter-metal dielectric region comprising a first interconnect structure, wherein the first electrode is disposed on the first interconnect structure; and
   a second inter-metal dielectric region above the first inter-metal dielectric region, the second inter-metal dielectric region comprising a second interconnect structure, wherein the second interconnect structure is disposed on the second electrode.

17. The device of claim 16, further comprising mask elements in the second inter-metal dielectric region, wherein the second electrode is between the mask elements and the mask elements have upper surfaces that are substantially coplanar with an upper surface of the second electrode.

* * * * *